United States Patent [19]

van de Plassche

[11] 4,290,025
[45] Sep. 15, 1981

[54] AMPLIFIER ARRANGEMENT WITH VARIABLE GAIN FACTOR

[75] Inventor: Rudy J. van de Plassche, Eindhoven, Netherlands

[73] Assignee: U.S. Philips Corporation, New York, N.Y.

[21] Appl. No.: 15,547

[22] Filed: Feb. 26, 1979

[30] Foreign Application Priority Data

Mar. 20, 1978 [NL] Netherlands ............ 7802973

[51] Int. Cl.³ .................. H03F 3/45; H03G 3/30
[52] U.S. Cl. .............................. 330/254; 330/257
[58] Field of Search ............ 330/254, 257; 307/355, 307/357; 328/160; 358/27; 364/841

[56] References Cited

U.S. PATENT DOCUMENTS 3,750,042  7/1973  Peil et al. ................. 330/254

Primary Examiner—James B. Mullins
Attorney, Agent, or Firm—William J. Streeter; Bernard Franzblau

[57] ABSTRACT

An amplifier arrangement with a variable gain factor comprising a first and a second emitter-coupled transistor and a third and a fourth emitter-coupled transistor. The collector electrodes of the first and third transistor are coupled to an output of the amplifier arrangement. Between the interconnected base electrodes of the first and the fourth transistor and the interconnected base electrodes of the second and the third transistor a control signal can be applied. A signal current is applied to the interconnected emitter electrodes of the first and the second transistor and to the interconnected emitter electrodes of the third and the fourth transistor by means of a first and a second voltage-current converter, respectively, at least one of the two converters comprising a signal input and both converters having negative feedback to the output of the amplifier arrangement.

17 Claims, 1 Drawing Figure

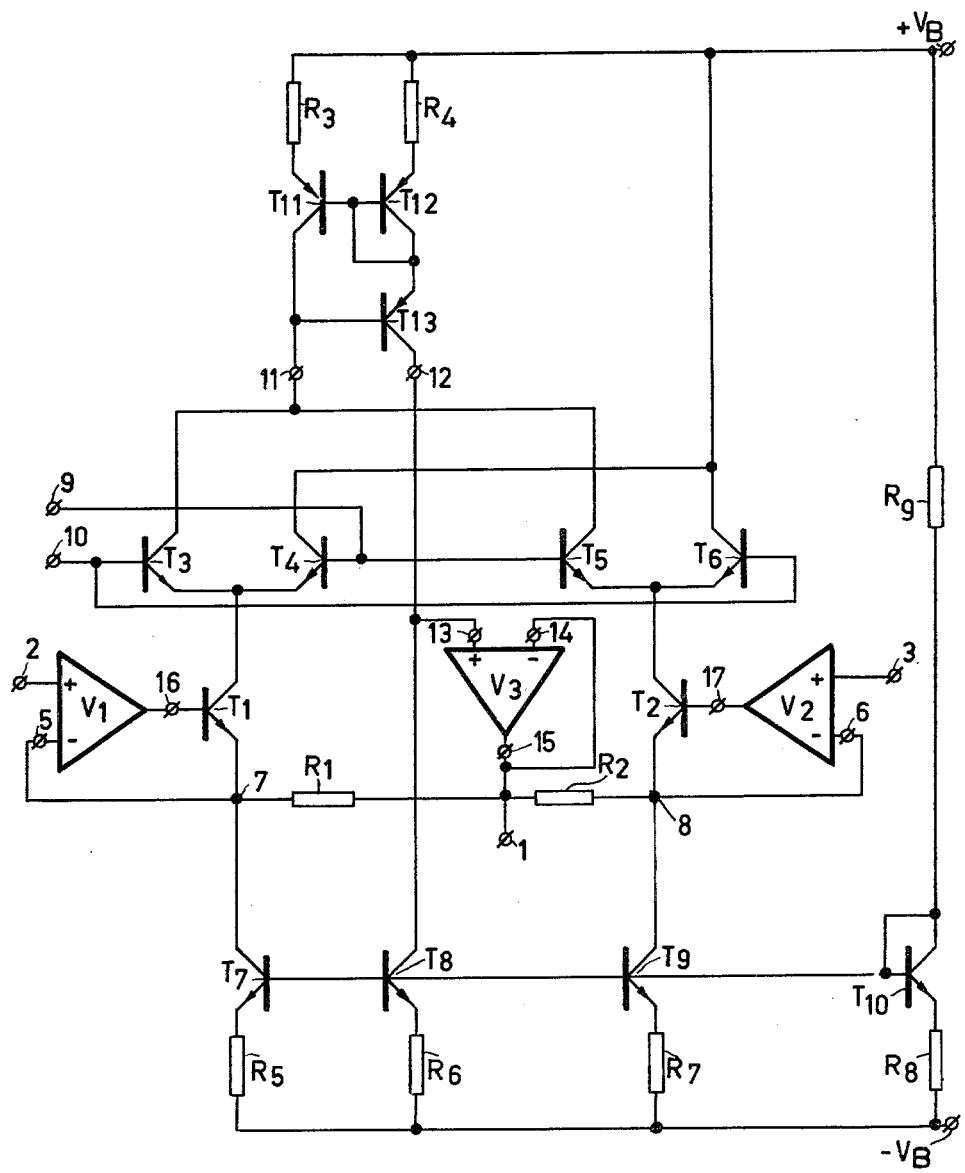

AMPLIFIER ARRANGEMENT WITH VARIABLE GAIN FACTOR

The invention relates to an amplifier arrangement with variable gain comprising a first and a second transistor with interconnected emitters, a third and a fourth transistor with interconnected emitters, an output which is coupled to the collectors of the first and the third transistors, means for applying a control voltage between the base electrodes of the first and the second transistors, the base electrode of the third transistor being connected to the base electrode of the second transistor and the base electrode of the fourth transistor being connected to the base electrode of the first transistor, quiescent current means for the application of quiescent currents to the interconnected emitters of the first and the second transistors and to the interconnected emitters of the third and the fourth transistor and signal current means for the application of signal current to at least the interconnected emitters of the first and the second transistors.

Such amplifier arrangements are generally known as automatic gain control circuits, electronic potentiometers etc. and may be employed in, inter alia, volume and tone control circuits in audio equipment. If, moreover, an a.c. signal is applied to the control signal input such circuit arrangements may be employed as multipliers, modulators or demodulators.

Such circuit arrangements, for example those in accordance with U.S. Pat. No. 3,684,974, generally comprise a single-ended or differentially driven differential pair with a current distribution circuit in each of the collector circuits of the two transistors of said differential pair. These current distribution circuits each comprise two transistors whose emitters are connected to the collector of that transistor in whose collector circuit they are included. The base of one of the two transistors of the one current distribution circuit is then connected to the base of one of the transistors of the other current distribution circuit and the bases of the two other transistors are also interconnected. By the application of a voltage between the two pairs of interconnected base electrodes the current distribution factors of the two current distribution circuits can be controlled. An output signal with a d.c. component which is independent of a current distribution is obtained by connecting the collector of the one transistor of the one current distribution circuit to the collector of the other transistor of the other current distribution circuit. If the gain factor of the input differential pair is A and the current distribution factor is K ($0 \leq K \leq 1$), the gain will be AK. If a second output is formed by connecting the collector of the other transistor of the one current distribution circuit to the collector of the one transistor of the other current distribution circuit, the gain at said second output will be $(1-K)A$. Such an amplifier arrangement may then be regarded as two amplifiers with gain factors AK and $(1-K)A$ and common input(s).

In such an amplifier the gain factor is also determined by the term A, which depends on the components which are used, so that it is inter alia temperature-dependent. Also, the inequality of the components and the non-linearity of the input differential pair give rise to drift and signal distortion.

It is known to eliminate said dependence to a large extent by the use of negative feedback. The negative-feedback factor then determines the gain factor. However, negative feedback between the output and input of such an amplifier arrangement would also eliminate the effect of the current distribution circuit, i.e. the factor K, so that the amplifier arrangement would no longer be controllable.

From U.S. Pat. No. 3,891,937 it is known to use the signal which has been amplified by a factor AK as the output signal and the signal which has been amplified by the factor $A(1-K)$ as the negative-feedback signal. If in such a case the negative feedback is a maximum and the input signal is $V_i$, the following expression is valid for the output signal $V_u$:

$$V_u = \frac{AK}{1 + A(1-K)} V_i$$

If K is substantially unity the following approximation is valid:

$$V_u = AK V_i$$

In this case the negative feedback has substantially no effect.

If K is substantially equal to O and the factor A is very great, the following approximation is valid:

$$V_u = K V_i$$

In this case the negative feedback is optimal.

The drawback of this method of negative feedback is that the degree of negative feedback depends on the variable factor K, but for some uses this is more favourable than no negative feedback.

From U.S. Pat. No. 3,875,522 an amplifier arrangement with controllable gain and k-independent negative feedback is known. This amplifier arrangement comprises a first and a second pair of emitter-coupled transistors, the collectors of first transistors of both pairs together constituting the output, while the base electrodes of said first transistors constitute two independent inputs. The negative feedback is obtained in that the output is connected to the base electrodes of second transistors of both pairs. The gain factor can then be controlled by controlling the quiescent currents applied to the interconnected emitters of both pairs relative to each other. In this amplifier the negative feedback is optimal. However, since the mutual conductance is controlled the non-linearity of the transistors of both pairs still gives rise to distortion, in particular at the limits of the control range where one of the two pairs always receives a comparatively small quiescent current.

It is an object of the invention to provide an amplifier arrangement of the type mentioned in the preamble, i.e. without mutual-conductance control, with k-independent negative feedback. For this the invention is characterized in that said signal current means comprise a first voltage-current converter having a first input which is inverting relative to the output of the amplifier arrangement and a second input, which constitutes the first signal voltage input of the amplifier arrangement, and a second voltage-current converter having at least a first input which is inverting relative to the output of the amplifier arrangement, the first inputs of the first and the second voltage-current converters being connected to the output of the amplifier arrangement.

If the signal on the signal input of the first voltage-current converter is $V_{i1}$ and if the second voltage-current converter has a signal input with a signal $V_{i2}$, the output signal $V_S$ will be:

$$V_S = AKV_{i1} + A(1-K)V_{i2}.$$

If this signal is completely applied to the two voltage-current converters in a degenerative sense, the following is valid for $A \gg 1$ when $V_{i1}$ and $V_{i2}$ are respectively substituted by $(V_{i1}-V_S)$ and $(V_{i2}-V_S)$ in the preceding expression:

$$V_S = KV_{i1} + (1-K)V_{i2}.$$

In this respect it is to be noted that the signal input of the second voltage-current converter need not necessarily be present. In that case:

$$V_S = KV_{i1}.$$

It is to be noted that the amplifier arrangement in accordance with the invention is not limited to arrangements using bipolar transistors. If for example field-effect transistors are used, base, emitter and collector electrode should respectively be read as gate, source and drain electrode.

The invention will now be described in more detail with reference to the FIGURE which shows a preferred embodiment of an amplifier arrangement in accordance with the invention.

This arrangement comprises a first voltage-current converter including a transistor $T_1$ whose base is connected to the output 16 of an amplifier $V_1$. The non-inverting input of amplifier $V_1$ constitutes the signal input 2 and the inverting input 5 is connected to the emitter of transistor $T_1$. The emitter of transistor $T_1$ is connected to a quiescent-current source comprising a transistor $T_7$ and a resistor $R_5$ and to a negative-feedback input 1 via a resistor $R_1$.

A second voltage-current converter comprises a transistor $T_2$ whose base is connected to output 17 of amplifier $V_2$. The non-inverting input of amplifier $V_2$ constitutes the signal input 3 and the inverting input 6 is connected to the emitter of transistor $T_2$. The emitter of transistor $T_2$ is connected to the quiescent-current source comprising a transistor $T_9$ and resistor $R_7$ and to the negative feedback input 1 via a resistor $R_2$.

The collector electrode of transistor $T_1$ is connected to the common emitter electrodes of transistors $T_3$ and $T_4$, which constitute a current distribution circuit. The base electrodes of said transistors $T_3$ and $T_4$ are connected to control-signal inputs 10 and 9 respectively. Similarly, the collector of transistor $T_2$ is connected to the common emitter electrodes of transistors $T_5$ and $T_6$, which constitute a second current distribution circuit. The base electrodes of transistors $T_5$ and $T_6$ are connected to control signal inputs 9 and 10 respectively. The collector electrodes of transistors $T_4$ and $T_6$ are connected to power supply terminal $+V_B$ and the collector electrodes of transistors $T_3$ and $T_5$ to the input 11 of a current-mirror circuit comprising transistors $T_{11}$, $T_{12}$ and $T_{13}$ and resistors $R_3$ and $R_4$. The output 12 of the current mirror circuit is connected to a quiescent-current source comprising a transistor $T_8$ and a resistor $R_6$ and to the non-inverting input 13 of a differential amplifier $V_3$, whose output 15 is connected to the negative-feedback input 1. Said differential amplifier $V_3$ is connected as a voltage-follower arrangement in that the inverting input 14 is connected to the output 15. The output terminal 1 is coupled to the collectors of transistors $T_3$ and $T_5$ via amplifier $V_3$ and the current mirror circuit.

The current source transistors $T_7$, $T_8$ and $T_9$ have a specific d.c. setting in that a series connection of the resistor $R_9$, the transistor $T_{10}$ which is connected as a diode, and the resistor $R_8$ is included between the power supply terminals $+V_B$ and $-V_B$. The voltage across diode $T_{10}$ and resistor $R_8$ is applied to the base electrodes of transistors $T_7$, $T_8$ and $T_9$.

An input signal voltage $V_{i1}$ at input 2 appears at the emitter 7 of the transistor $T_1$ because amplifier $V_1$ receives negative feedback via the base-emitter junction of transistor $T_1$. Similarly, a signal input voltage $V_{i2}$ on input 3 appears on the emitter 8 of transistor $T_2$. Thus, a signal voltage $V_{i1}-V_u$ appears across resistor $R_1$ and a signal voltage $V_{i2}-V_u$ across resistor $R_2$. If resistors $R_1$ and $R_2$ have a resistance value equal to $R_o$ the collector signal current of transistor $T_1$ equals $(V_{i1}-V_u)/R_o$ and the collector signal current of transistor $T_2$ equals $(V_{i2}-V_u)/R_o$.

The arrangement of transistor $T_1$, differential amplifier $V_1$ and resistor $R_1$, as well as that of transistor $T_2$, differential amplifier $V_2$ and resistor $R_2$ may each be described as a voltage-current converter. The voltage $V_{i1}-V_S$ is converted into a current $(V_{i1}-V_S)/R_o$ across resistor $R_1$. This conversion can also be achieved with other types of converters.

The collector currents of transistors $T_3$ and $T_4$ as well as those of transistors $T_6$ and $T_5$ are in a ratio of $K:1-K$, K being determined by the voltage across the inputs 9 and 10. The input signal current at input 11 of the current mirror and, in the case that the current mirror has a gain factor of unity, also at output 12 of said current mirror, is then $$K \frac{(V_{i1}-V_u)}{R_o} + (1-K)\frac{(V_{i2}-V_u)}{R_o}$$

If the signal impedance constituted by the collector impedance of transistor $T_8$ in parallel with the input impedance of amplifier $V_3$ has a value $R_t$, the voltage $V_u$ at output 12 will be:

$$V_u = K\frac{R_t}{R_o} \cdot n(V_{i1}-V_u) + (1-K)\frac{R_t}{R_o} n(V_{i2}-V_u)$$

where n represents the current mirror gain and the base current losses of transistors $T_1$, $T_2$, $T_3$ and $T_5$.

If the factor $R_t/R_o$. n is substantially greater than unity, the following is found for $V_u$:

$$V_u = KV_{i1} + (1-K)V_{i2}.$$

If the collector currents of transistors $T_7$, $T_8$ and $T_9$ are equal, the quiescent current at output 12 of the current mirror is equal to the collector current of transistor $T_8$ when the base current losses are neglected.

What is claimed is:

1. An amplifier arrangement with variable gain comprising, a first and a second transistor with interconnected emitters, a third and a fourth transistor with interconnected emitters, an output coupled to the collectors of the first and the third transistor, means for applying a control voltage between the base electrodes of the first and the second transistor, means connecting the base electrode of the third transistor to the base electrode of the second transistor and the base electrode of the fourth transistor to the base electrode of the first transistor, quiescent current means for applying quiescent currents to the interconnected emitters of the first and the second transistor and to the interconnected emitters of the third and the fourth transistor, and signal current means for applying signal current to at least the interconnected emitters of the first and the second transistor, and wherein said signal current means comprise, a first voltage-current converter having a first input which is inverting relative to the output of the amplifier arrangement and a second input which comprises a first signal voltage input of the amplifier arrangement, a second voltage-current converter having at least a first input which is inverting relative to the output of the amplifier arrangement, and means connecting the first inputs of the first and the second voltage-current converters to the output of the amplifier arrangement.

2. An amplifier arrangement as claimed in claim 1 wherein the first voltage-current converter comprises a fifth transistor having a collector electrode connected to the interconnected emitter electrodes of the first and the second transistor, and the second voltage-current converter comprises a sixth transistor having a collector electrode connected to the interconnected emitter electrodes of the third and the fourth transistor.

3. An amplifier arrangement as claimed in claim 2 wherein the fifth transistor has a base electrode coupled to the first signal input of the amplifier arrangement, and means connecting an emitter electrode of the fifth transistor to an emitter electrode of the sixth transistor to constitute a common negative-feedback input which is connected to the output of the amplifier arrangement in a degenerative sense.

4. An amplifier arrangement as claimed in claim 3 wherein said connecting means comprises a first resistor connected between the emitter of the fifth transistor and the common negative-feedback input and a second resistor connected between the emitter of the sixth transistor and the common negative-feedback input, said second resistor having a resistance value which is substantially equal to that of the first resistor.

5. An amplifier arrangement as claimed in claim 4 wherein the first voltage-current converter further comprises a differential amplifier having said first inverting input and a non-inverting input comprising said second input of the converter and an output, the output of the first converter being connected to the base of the fifth transistor and the inverting input to the emitter of the fifth transistor.

6. An amplifier arrangement as claimed in claims 3 or 4 further comprising, means connecting a base electrode of the sixth transistor to a second signal input of the amplifier arrangement.

7. An amplifier arrangement as claimed in claim 6 wherein the second voltage-current converter further comprises a differential amplifier having said first inverting input and a non-inverting input and an output, the output of the second converter being connected to the base of the sixth transistor, the inverting input to the emitter of the sixth transistor and the non-inverting input to the second signal input of the amplifier arrangement.

8. An amplifier arrangement as claimed in claim 4 or 5 wherein said quiescent current means further comprises means connecting the emitters of the fifth and the sixth transistor each to a quiescent-current source.

9. An amplifier arrangement as claimed in any of the claims 2 to 5 wherein the output circuit of the amplifier arrangement includes means having a high impedance, across which high impedance the output current of the amplifier arrangement is converted into a voltage.

10. An amplifier arrangement as claimed in claim 9, wherein said means having a high impedance constitute a current source.

11. An amplifier arrangement as claimed in claim 9 wherein the output circuit comprises a differential amplifier having an inverting and a non-inverting input and an output, the output being connected to the common negative-feedback input and to the inverting input of the differential amplifier and the non-inverting input being connected to the output of the amplifier arrangement.

12. An amplifier arrangement as claimed in any of the claims 2 to 5 wherein the amplifier arrangement comprises a current mirror having an input connected to the collector of the first and the collector of the third transistor, and wherein an output of the current mirror comprises the output of the amplifier arrangement.

13. An amplifier arrangement as claimed in claim 6 wherein said quiescent current means further comprises means connecting the emitters of the fifth and the sixth transistors each to a quiescent current source.

14. An amplifier arrangement as claimed in claim 7 wherein said quiescent current means further comprises means connecting the emitters of the fifth and the sixth transistors each to a quiescent current source.

15. An amplifier arrangement as claimed in claim 6 wherein the amplifier arrangement comprises a current mirror having an input connected to the collector of the first and the collector of the third transistor, and wherein an output of the current mirror comprises the output of the amplifier arrangement.

16. An amplifier arrangement as claimed in claim 7 wherein the amplifier arrangement comprises a current mirror having an input connected to the collector of the first and the collector of the third transistor, and wherein an output of the current mirror comprises the output of the amplifier arrangement.

17. A variable gain amplifier comprising, first, second, third and fourth transistors each having first and second electrodes defining a current path in the transistor and a control electrode, means interconnecting the first electrodes of the first and second transistors, means interconnecting the first electrodes of the third and fourth transistors, means interconnecting the control electrodes of the first and fourth transistors and the control electrodes of the second and third transistors to form first and second input terminals, respectively, for receiving a variable control voltage, an output terminal of the amplifier coupled to the interconnected second electrodes of the first and third transistors, means for applying quiescent currents to the interconnected first electrodes of the first and second transistors and to the interconnected first electrodes of the third and fourth transistors, and means for applying a signal current to the interconnected first electrodes of the first and second transistors comprising first and second voltage-current converters each having a first input coupled to the output terminal to provide a negative feedback and one converter having a separate signal voltage input terminal that is indepedent of said output terminal.

* * * * *